United States Patent [19]

Tiburtius et al.

[11] Patent Number: 5,518,758
[45] Date of Patent: May 21, 1996

[54] ARRANGEMENT FOR THE CONDUCTION AWAY OF HEAT AND A PROCESS FOR THE PRODUCTION THEREOF

[75] Inventors: Bernd Tiburtius, Kleinmachnow; Helmut Kahl, Berlin, both of Germany

[73] Assignee: EMI-tec Elektronische Materialien GmbH, Berlin, Germany

[21] Appl. No.: 342,225

[22] Filed: Nov. 18, 1994

[30] Foreign Application Priority Data

Nov. 18, 1993 [DE] Germany .............................. 43 39 786.7

[51] Int. Cl.⁶ ............................... B05D 3/02; B05D 5/00
[52] U.S. Cl. ............................ 427/8; 165/185; 174/16.3; 361/705; 427/286; 427/385.5; 427/388.2
[58] Field of Search .................................. 165/185; 427/8, 427/286, 385.5, 388.2; 174/16.3; 361/705

[56] References Cited

U.S. PATENT DOCUMENTS

| | | | |
|---|---|---|---|
| 4,326,238 | 4/1982 | Takeda et al. | 361/386 |
| 4,546,410 | 10/1985 | Kaufman | 361/387 |
| 4,654,754 | 3/1987 | Daszkowski | 361/388 |
| 4,689,720 | 8/1987 | Daszkowski | 361/386 |
| 4,791,439 | 12/1988 | Guiles | 347/88 |
| 5,247,426 | 9/1993 | Hamburgen et al. | 361/705 |

FOREIGN PATENT DOCUMENTS

| | | |
|---|---|---|
| 1913679 | 9/1970 | Germany . |
| 2303119 | 8/1973 | Germany . |
| 2511010A1 | 9/1976 | Germany . |
| 2614917A1 | 10/1976 | Germany . |
| 9106035U1 | 11/1992 | Germany . |

OTHER PUBLICATIONS

European Search Report, dated Jul. 29, 1995.
IBM Technical Disclosure Bulletin Entitled "Hook and Loop Thermal Conductive Mesh" by H. Parsapour, vol. 21 No. 9, dated Feb. 1979.
German Patent Office Search Report dated Jun. 9, 1994.

Primary Examiner—Michael Lusignan
Attorney, Agent, or Firm—Chilton, Alix & Van Kirk

[57] ABSTRACT

A heat diffuser for conducting heat away from a heat generating assembly. The heat diffuser is composed of a heat-conducting polymeric material. The heat diffuser is formed by dispensing strips of the polymeric material directly onto a surface area of the assembly. A computer-controlled nozzle assembly is utilized to disperse the polymeric material. The heat diffuser may be composed of multiple layers wherein the polymeric material for different layers has different mechanical and/or heat conducting properties.

13 Claims, 9 Drawing Sheets

ARRANGEMENT FOR THE CONDUCTION AWAY OF HEAT AND A PROCESS FOR THE PRODUCTION THEREOF

BACKGROUND OF THE INVENTION

The invention relates generally to a method and apparatus for the removal of heat from the housing of heat generating assemblies. More particularly, the present invention relates to a method and apparatus for the removal of heat from the housing of an electronic switching component.

Electronic components or assemblies whose operation produces large quantities of heat caused by energy dissipation, and which are encapsulated in plastics, ceramics or metal housings, are usually provided with cooling elements or members which enable the excess heat produced to escape into the environment, primarily by convection and/or by conduction of heat. For heat conduction, in the case of components having a high level of heat caused by energy losses, it is conventional to use, in particular, carriers or housings or housing parts which are good conductors of heat, and more especially are made of metal, with the maximum possible surface area. Frequently, the corresponding carrier elements or housings or housing parts are ribbed for this purpose and/or their surface is subjected to a high-speed air current produced by a fan.

It is known to use mica flakes or heat-conducting pastes, such as silicone paste with added aluminum oxide, for this purpose.

An arrangement of this kind is known from U.S. Pat. No. 4,654,754A1 in which heat-conducting projections of elastic, heat-conducting material are applied to a heat source, so that they deform.

This arrangement is complicated to produce, since the elements in question have to be manufactured in suitable molds which only allow the production of shapes capable of being removed from molds. In addition, the construction of non-cohesive structures is difficult since a plurality of individual molds have to be produced for this purpose. Consequently, in manufacture, there is the disadvantage of complicated handling, which does not suit the present day requirements of the electronics industry and/or the problem of unsatisfactory properties in the operation of the electronic components or assemblies (poor heat transmission properties, smearing of the carrier, particularly in the case of large differences in temperature, etc.).

SUMMARY OF THE INVENTION

The aim of the invention is therefore to provide an arrangement of the kind described hereinbefore which differs from the known arrangements by improved technological handling qualities and properties of use, together with a process for producing it.

This objective is achieved by means of an arrangement having the features of claim 1 and by a process according to claim 11.

The invention includes the idea of providing an arrangement for conducting heat away, which includes the component or assembly which is to be cooled, wherein the means which bring about the transfer of heat to the environment are produced, in a technologically progressive manner, in the form of strips directly onto the component or assembly which is to be cooled or on a separate cooling member, or possibly constructed so that they take over the function of the cooling member, thereby dispensing with the cooling member altogether. In this way, it is possible to produce heat-conducting flexible structures having a mushroom-like contour (or the negative image thereof) and which can be readily produced by conventional molding means (including extrusion). In this way, electronic components may be attached to a holder by "buttoning on", for example, without any other fixing.

One favorable method of doing this is to provide a heat-conduction plastics molding formed directly on the surface of the electronic component or assembly, which itself has the surface area required to give off heat into the environment or which establishes a heat-conducting connection with a separate heat diffuser which is subsequently attached to the component/plastics molding unit.

A second possibility is to provide a heat diffuser (cooling member) which is formed separately from the component or assembly, which may consist of the carrier which would be required in any case or an external housing (part) enclosing one or more components or assemblies, with a heat-conducting plastics molding formed directly on the surface thereof, this plastics molding being in contact with the surface of said component or assembly at least during operation of the latter. The heat diffuser may be attached to the component or assembly by screwing or pressing, in particular, or may be releasably pressed onto it, possibly by suitable moving and locking of a movable housing part.

Particularly in this alternative embodiment of the arrangement according to the invention, it is advantageous, in terms of use, if the plastics molding is elastically deformable or compressible at least in parts, so that, whilst ensuring intimate surface contact between the component or assembly and the heat diffuser under suitable contact pressure, a very low heat transfer resistance is achieved and, if desired, a seal may also be formed at the same time (e.g. to seal off the interior of the outer housing). The elastic or compressible configuration of the molding balances out any tolerances between the external housing and the component housing, in particular, so that one half of the housing in which the components or assemblies to be cooled are already mounted, can be brought into thermal contact simply by fitting it together with the other half of the housing, without any special additional measures. This type of maneuver is of particular importance especially for assemblies used in microelectronics and miniaturized housings, such as hand-held radio telephones.

Using the measures according to the invention, it is possible to produce very high packing densities for components, in which the necessary cooling can be achieved for individual (possibly differently shaped) components, even in the most confined space, if the cooling members are applied in paste form by means of dispensers. All the components are contacted equally, as a result of the housing being closed, irrespective of their shape and of any tolerances to be taken up. For servicing, a housing of this kind can be opened at any time. However, the intervals between services are lengthened by the measures according to the invention, since the life of electronic semiconductor components increases substantially as the operating temperature is reduced. The compressible heat-conducting plastics material is applied, particularly, by providing recesses directed substantially in the direction of heat transfer, these recesses being capable of receiving material up to a maximum compression, within the tolerance range envisaged, when the housing is assembled. The invention includes the finding that the improvement in heating contact brought about by the improved heat conductivity through the abutting regions of the elastic cooling member is greater than the increase in heating resistance brought about by the recesses with their reduced conductive cross-section.

For optimum heat transfer, there is also a suitable modification according to which the component or assembly and heat diffuser each have a plastics molding with at least one free surface and the free surfaces of these plastics moldings face each other and are in contact with each other at least when the component or assembly is in the operational state. The effective contact surface is maximized by the interlocking of offset, opposing projections and depressions on the two, preferably flexible, plastics moldings.

Particularly if there are very large gaps to be bridged between the component housing and the external housing, it may be advisable to provide cooling members according to the invention on both surfaces which will be in contact when the component is assembled, these cooling members making contact with each other over a certain area in the final assembled position and thus ensuring a good transfer of heat.

Preferably, the plastics molding is specially formed by dispensing plastics material in a plasticized state onto a surface of the component or assembly and pre-curing or setting the material.

It is technologically particularly beneficial if the plastics molding consists of a plastics material which cross-links or sets at ambient temperature, with heat-conducting additives, so that it can be formed without any complicated heating of the arrangement. Examples of heat-conducting additives which may be used include electrically non-conductive metal compounds (boron nitride, aluminum oxide) in powder form. If the component or assembly has an electrically insulating casing, electrically conductive additives such as metal powder may also be used.

A simple and mechanically stable arrangement with plastics moldings which are relatively thick in parts, such as may be necessary when a movable housing part which is to be sealed is used as a heat diffuser, is obtained if the plastics molding is built up in numerous layers, at least in parts, each layer being formed on the underlying layer in situ and permanently adhering thereto.

An arrangement of this kind is also advantageous in connection with another embodiment in which the plastics molding has knob-like or rib-like elevations which increase the surface area and/or elasticity thereof and thus improve the heat conduction characteristics. In fact, it makes it possible to form relatively high knobs or ribs with sufficiently accurately predictable shape and sufficient mechanical stability.

If this embodiment is adopted in order to improve the conduction away of heat in a plastics molding which itself acts as a cooling member, the knob-like or rib-like projections on the plastics molding are usefully arranged facing away from the surface of the component or assembly connected to said molding.

If, on the other hand, the special design of the surface of the plastics molding is intended to achieve the largest possible effective contact area between the component or assembly and the cooling member (heat diffuser), the knob-like or rib-like projections on the plastics molding face away from the surface of the heat diffuser connected thereto and towards the component or assembly.

The properties of the arrangement, particularly under fluctuating contact pressures, can be further improved by providing, adjacent to the knob-like or rib-like projections on the plastics molding, recesses in the plastics molding into which at least parts of the projections extend when the plastics molding is deformed.

If the knobs or ribs are formed specially to be inclined relative to the adjacent surface (of the plastics molding, or when individual knobs or ribs are formed directly on the component, the assembly or the cooling member, on the surface thereof), they fit sideways into the adjacent recess when the other part is pressed on and thus form a substantially compact heat transfer layer which is in good contact with both adjacent surfaces.

Further advantageous embodiments of the invention are recited in the subclaims or explained more fully hereinafter together with the description of the preferred embodiment of the invention with reference to the drawings wherein:

DETAILED DESCRIPTION OF THE INVENTION

Figure 1:
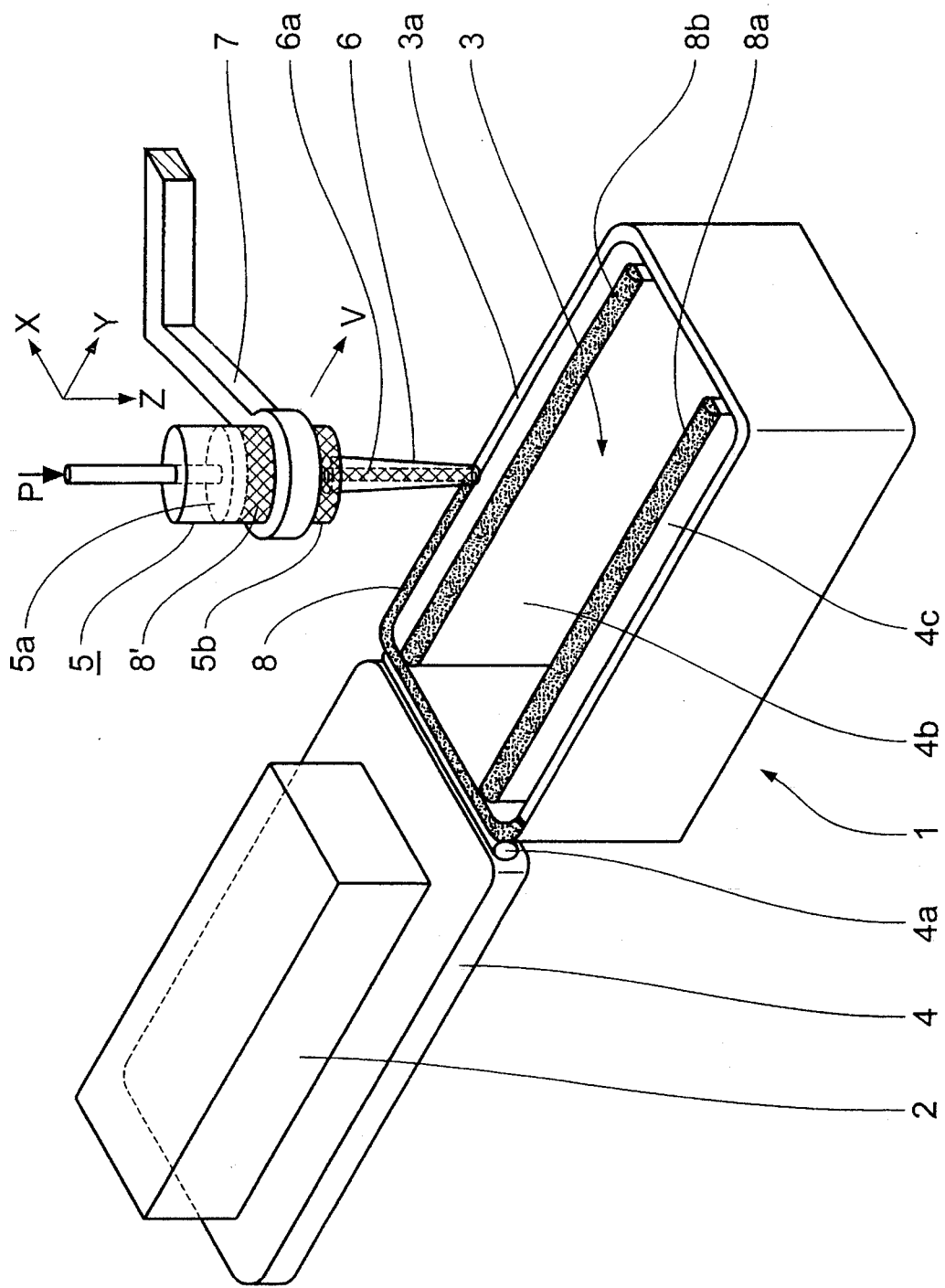
FIG. 1 is a diagrammatic sketch of an embodiment of an arrangement according to the invention and the process for producing it.

FIG. 1 shows an aluminum housing 1 as a thermal diffuser for an electronic switching assembly 2 which is secured in an electrically insulated manner on a carrier 4 which also serves as the lid of the housing. The housing 1 is intended both as protection for and for cooling the switching assembly 2. It has a recess 3 for the insertion of the switching assembly, which is closed with the carrier 4 of the assembly after being pivoted about a hinge 4a. Ribs 4b and 4c provided in the housing and contacting the carrier 4 when the housing is in its closed state, serve to improve the heat transfer.

FIG. 1 also shows how a profile 8 which conducts heat and electrically is applied to the outer wall of the housing portion 3 by dispensing through a nozzle or hollow needle 6 connected in an airtight manner to a piston/cylinder device 5, this nozzle 6 being guided together with the piston/cylinder device 5 by means of a computer-controlled robot arm 7 at a small and very accurately maintained spacing from the housing 1 at a pressure p being exerted on the piston 5a of the device 5. The profile extruded has the inner contour of the nozzle or hollow needle 6 as its outer contour. The robot arm is driven in the three spatial directions in accordance with the coordinates x, y and z shown. Corresponding profile strips 8a and 8b are also applied to the upper end edges of the ribs 4a and 4b.

The cylinder 5b of the device 5 is filled with a pasty silicone polymer 8' with metal particles incorporated therein, which dries in air at ambient temperature, and this polymer is squeezed out (dispensed) under the pressure exerted on the piston 5a, through the cannula 6a of the needle 6 onto the housing surface, where it adheres and hardens, in air, to form an elastic plastics profile 8.

The (cross-sectional) dimensions and configuration of the plastics profile 8 are also determined by the physico-chemical properties of the heat-conducting plastics mass used (particularly by its curing speed, viscosity, surface tension with respect to the housing material and thixotropy), by the cross-section of the cannula, the pressure exerted on the piston, the speed of needle movement and ambient influences such as temperature and relative humidity at the place of manufacture and can therefore be predetermined by a suitable choice of these parameters.

In the housing 1 shown in FIG. 1, having a flip-open lid 4 mounted on a hinge at one side, it may be beneficial to guide the applicator needle 6 along an edge portion of the opening 3 at a higher speed than in the other sections, so as to form a profile with a smaller cross-section than in the other sections of the edge, in a manner which facilitates the closing of the lid.

The properties of the plastics mass can be adjusted, in particular, by the addition of fillers (carbon black or the like), metal binders, surfactants and curing accelerators or cross-linking agents.

The type and particle size of the additives which ensure heat conductivity (such as boron nitride or aluminum oxide particles for electrically insulating plastics moldings, or carbon, silver, silver- or gold-coated copper particles or the like for electrically conductive plastics moldings) affects not only the thermal properties of the heat-conducting elastic material but also its mechanical, electrical and processing properties.

Figure 1A:
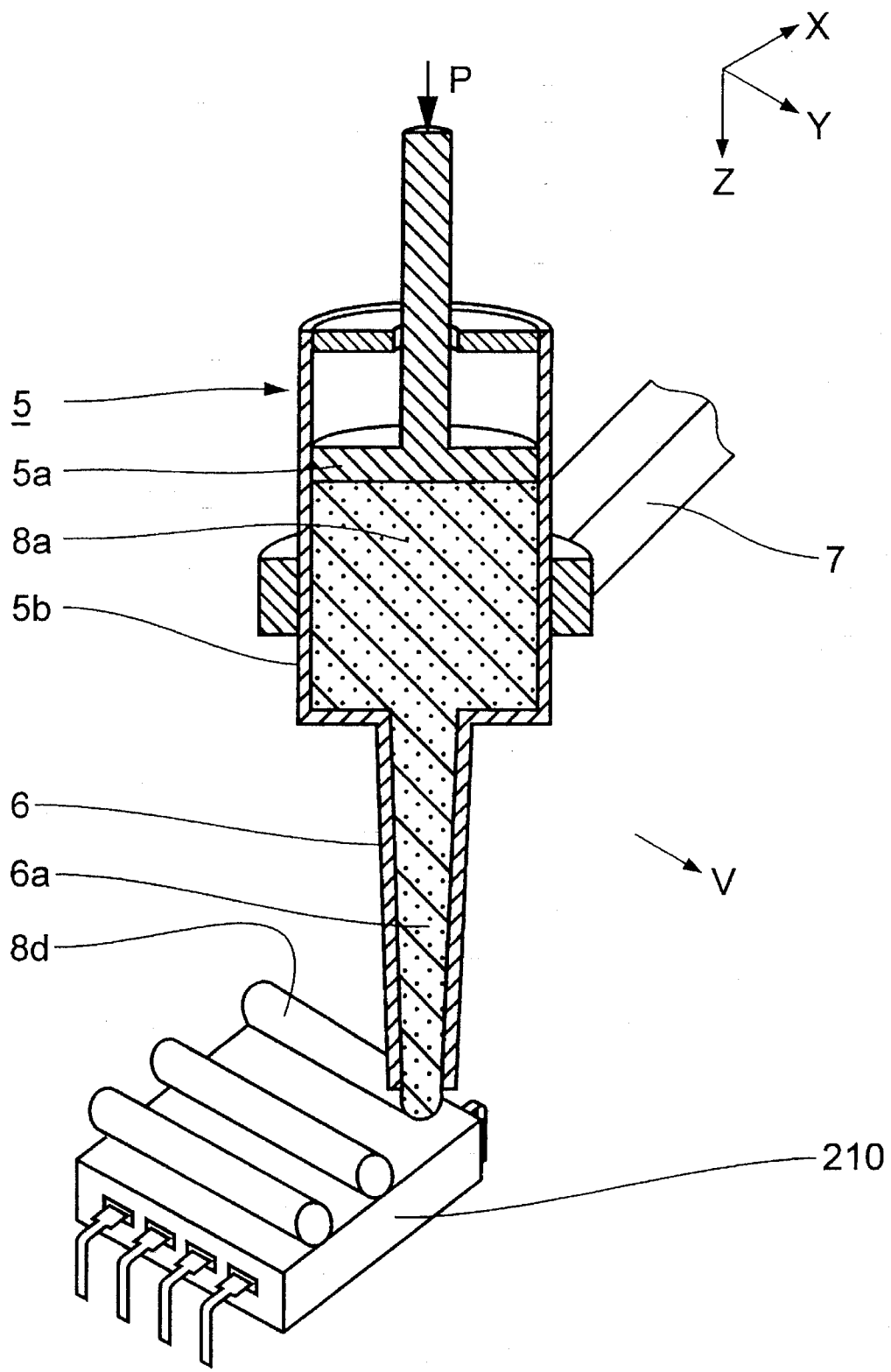
FIG. 1a is a detail from FIG. 1.

FIG. 1a shows the apparatus for applying the heat conducting and elastic plastics material in strip form, again in section on a larger scale. The reference numerals used in FIG. 1 still apply. The electronic component 210 in this case is a plastics-encased integrated circuit on which strip-like thermal coupling elements 8d are produced for heat conduction.

FIGS. 2a, 2b, 2c, 2d, 2e, 2f, 2h, and 2i show examples of different profile cross-sections produced by the process according to the invention, with the use of several application steps, in which the plastics molding extends substantially in one direction, i.e. constitutes a plastics profile.

Figure 2A:
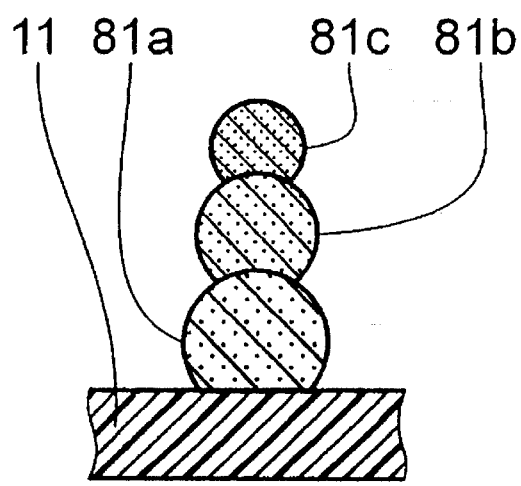
FIGS. 2a, 2b, 2c, 2d, 2e, 2f, 2h and 2i are diagrammatic partial cross-sectional views of plastics moldings which form part of some embodiments of the arrangement according to the invention.
Figure 2B:
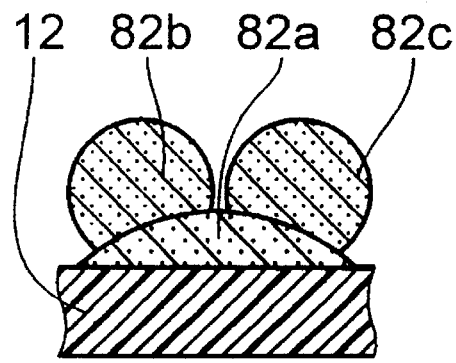
Figure 2C:
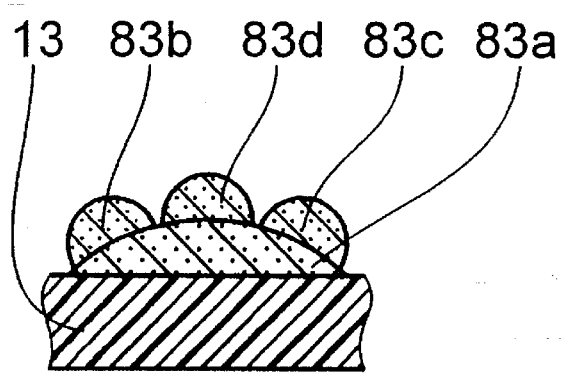

FIGS. 2a, 2b, and 2c, show sealing members which have good heat conduction and which are less elastic (shown shaded) combined with non-conductive sealing members which are more elastic owing to the absence of heat-conducting material, thereby achieving an optimum combination of sealing action and heat transfer.

FIGS. 2a, 2b, 2c, 2d, 2e, 2f, 2g, and 2h show examples of the configuration of strip-shaped heat-transmitting profile members produced by different nozzle shapes, which have been formed one after another partly by sequential application of different strip profiles. In this way, resilient heat-conducting members of any desired shape (even a shape which cannot be removed from a mold) can be produced which may also include cavities, for example.

FIG. 2a shows, in particular, a heat-transmitting and sealing structure formed from profiles 81a, 81b, 81c of substantially circular cross-section applied one on top of the other, in two application steps, to the surface of a housing portion 11. A structure of this kind is obtained if the resilient material slightly moistens the surface of the housing.

FIG. 2b shows a profile construction produced on a housing section 12 in three steps, consisting of a wide, shallow convex conductive profile member 82a and a conductive portion 82c "dispensed" onto it, and a non-conductive portion 82b, the parts 82b and 82c begin approximately circular in cross-section.

A structure of this kind is obtained when the material of the first profile member 82a wets the surface of the housing considerably and/or is applied with a relatively broad nozzle instead of the needle 6 shown in FIG. 2, whilst the material of the parts 82b shows only a slight tendency to moisten the surface of the part 82a.

FIG. 2c shows a structure similar to FIG. 2b, in which two substantially semicircular profile members 83b and 83c which are good conductors of heat are arranged on both sides of a highly elastic but not conductive and substantially semicircular sealing profile 83d centrally arranged on a lower, broad profile section 83a on a housing surface 13.

This latter profile shows great stability in the face of forces acting parallel to the housing surface, but has comparatively low elasticity overall. Consequently, it may be particularly suitable for sliding closures.

Figure 2D:
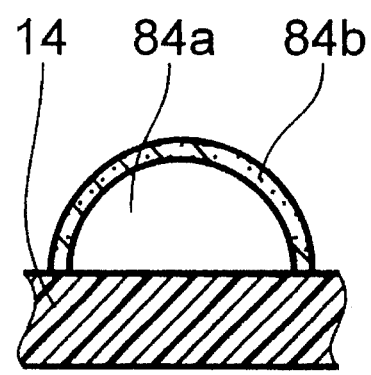

The profile according to FIG. 2d, on the other hand, which consists of a semicircular elastic profile member 84a which is a poor conductor of heat, pressed onto a housing surface 14, and a coating 84b which envelopes the surface thereof and is a good conductor of heat, has extremely good elasticity but limited heat conducting capacity.

Figure 2E:
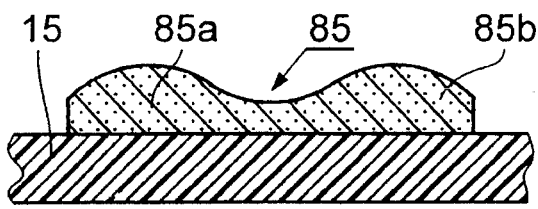
Figure 2F:
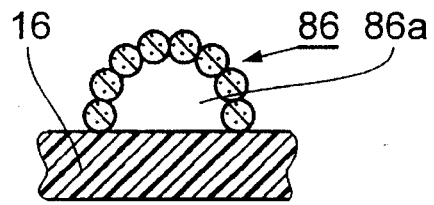
Figure 2G:
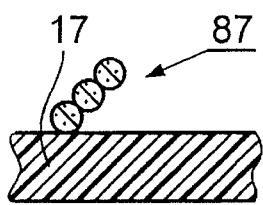
Figure 2H:
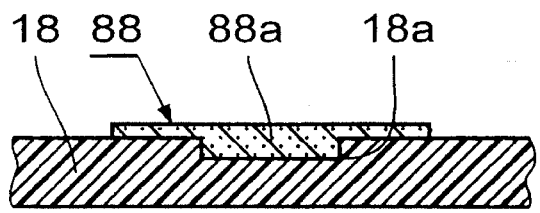
Figure 2I:
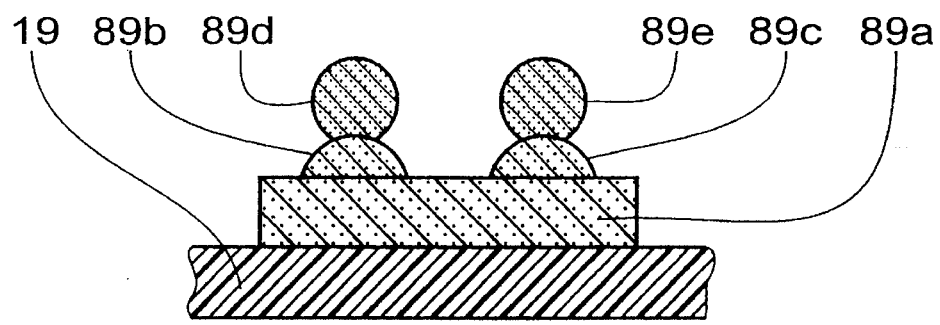

FIGS. 2e and 2i show plastics shapes consisting exclusively of material which conducts heat.

FIG. 2e shows a specially shaped one-piece profile 85 on a housing surface 15 which has two beads 85a and 85b connected by a flat web. A profile of this kind may be suitable for housings with edge-profiled snap-fit closures.

FIG. 2f shows a plastics profile 86 of semicircular overall shape made up of a plurality of circular profile strips, on a housing surface 16 which encloses an air chamber 86a with said surface 16.

The interaction of the profile with this "air chamber" ensures good elasticity of the whole profile in spite of the comparatively poor elasticity of its components.

FIG. 2g shows a profile 87 where the shape is only a section of the shape of the profile in FIG. 2f on a surface 17.

FIG. 2h shows a T-shaped profile 88 on a housing surface 18 which has a rectangular groove 18a, said profile 88 engaging with a central part 88a, provided for this purpose, in the groove 18a and having overall a planar surface parallel to the housing surface 18 apart from the groove 18a.

This profile is connected to the housing surface not only by engagement of material but also by interlocking engagement, which additionally increases the stability.

FIG. 2i shows a profile structure consisting of a block 89a of flexible, conductive material having a substantially rectangular cross-section, and two shallow convex profile parts 89b and 89c arranged side by side thereon, this profile structure being particularly suitable for transmitting large amounts of heat owning to its large cross-section, but also having sufficient elasticity thanks to the sealing lips 89d and 89e provided thereon.

Figure 3:
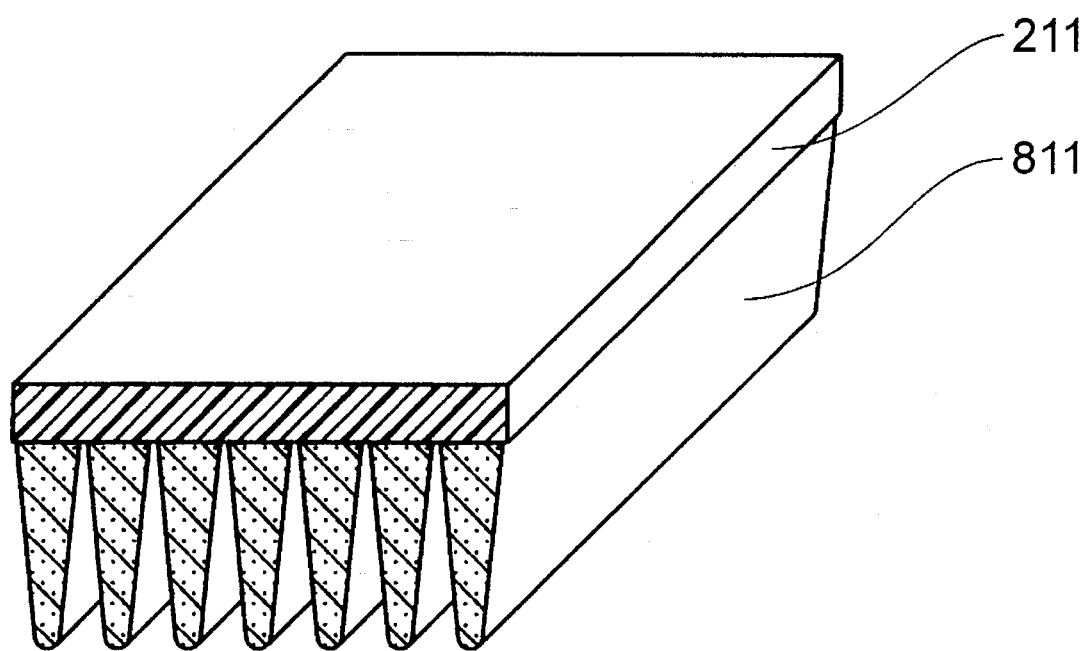
FIG. 3 is a view of an electronic component with plastics cooling elements dispensed directly onto the surface, as a further embodiment of the invention.

FIG. 3 diagrammatically shows an electronic assembly 211 having a plastics cooling member 811, provided thereon as shown in FIG. 1, which consists of cooling ribs individually applied to the surface of the assembly in layers in a plurality of extrusion steps. Such an arrangement may be used, for example, in electronic equipment for mobile use (radio equipment, mobile telephones, etc.).

Figure 4A:
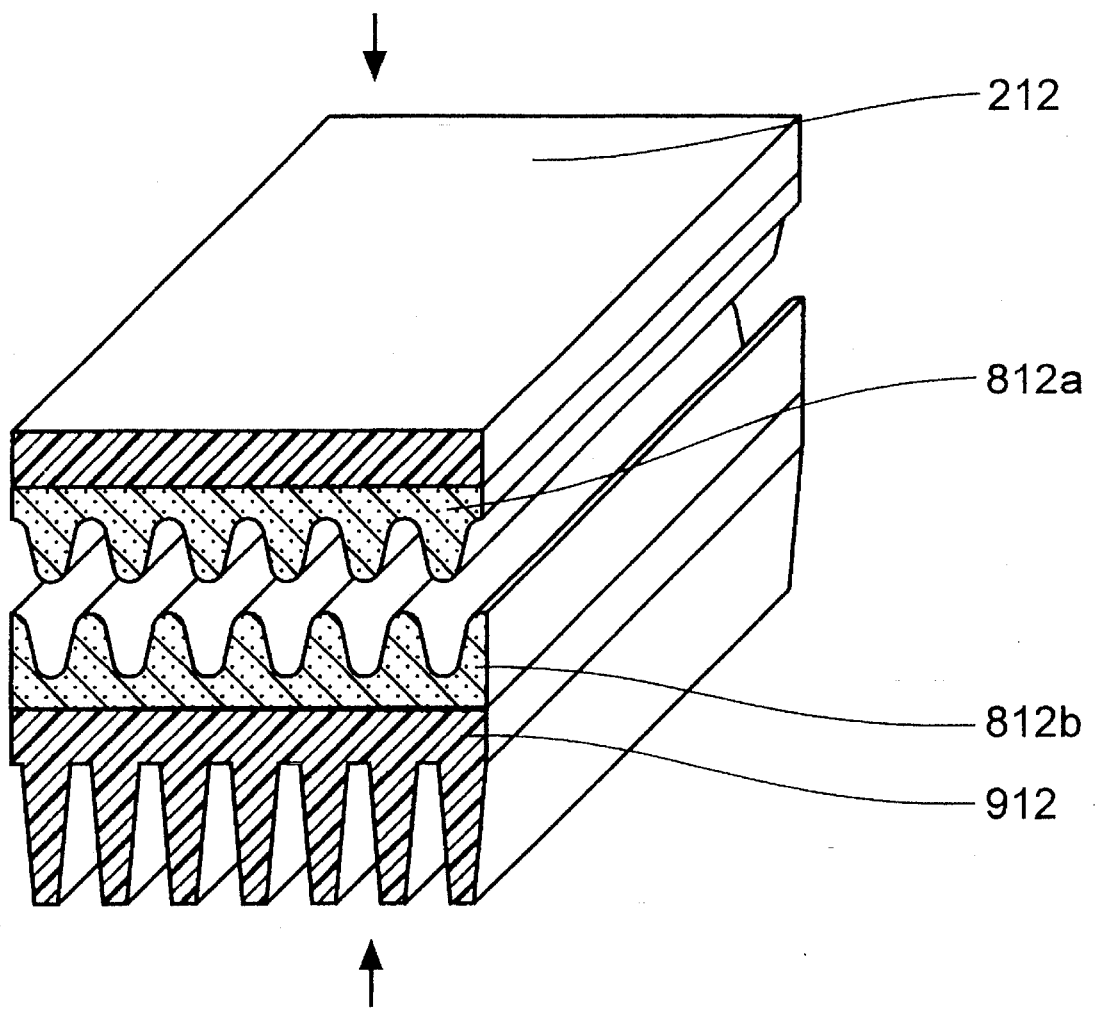
FIGS. 4a and 4b show other embodiments of the arrangement according to the invention.

FIG. 4a diagrammatically shows an electronic assembly 212 with a heat-conducting plastics member 812a formed thereon which has a corrugated surface, viewed in cross-section, and is connected to a ribbed cooling ember 912 acting as a heat diffuser, which has a second plastics molding 812b formed on the flat surface thereof. This surface has the same structure as that of the first plastics molding 812a, but is mounted somewhat laterally offset relative thereto, so that the projections on one body fit into depressions in the other and, by virtue of their elasticity, the two bodies form a virtually homogeneous heat transmission layer when the assembly 212 and cooling member 912 are pressed together.

Figure 4B:
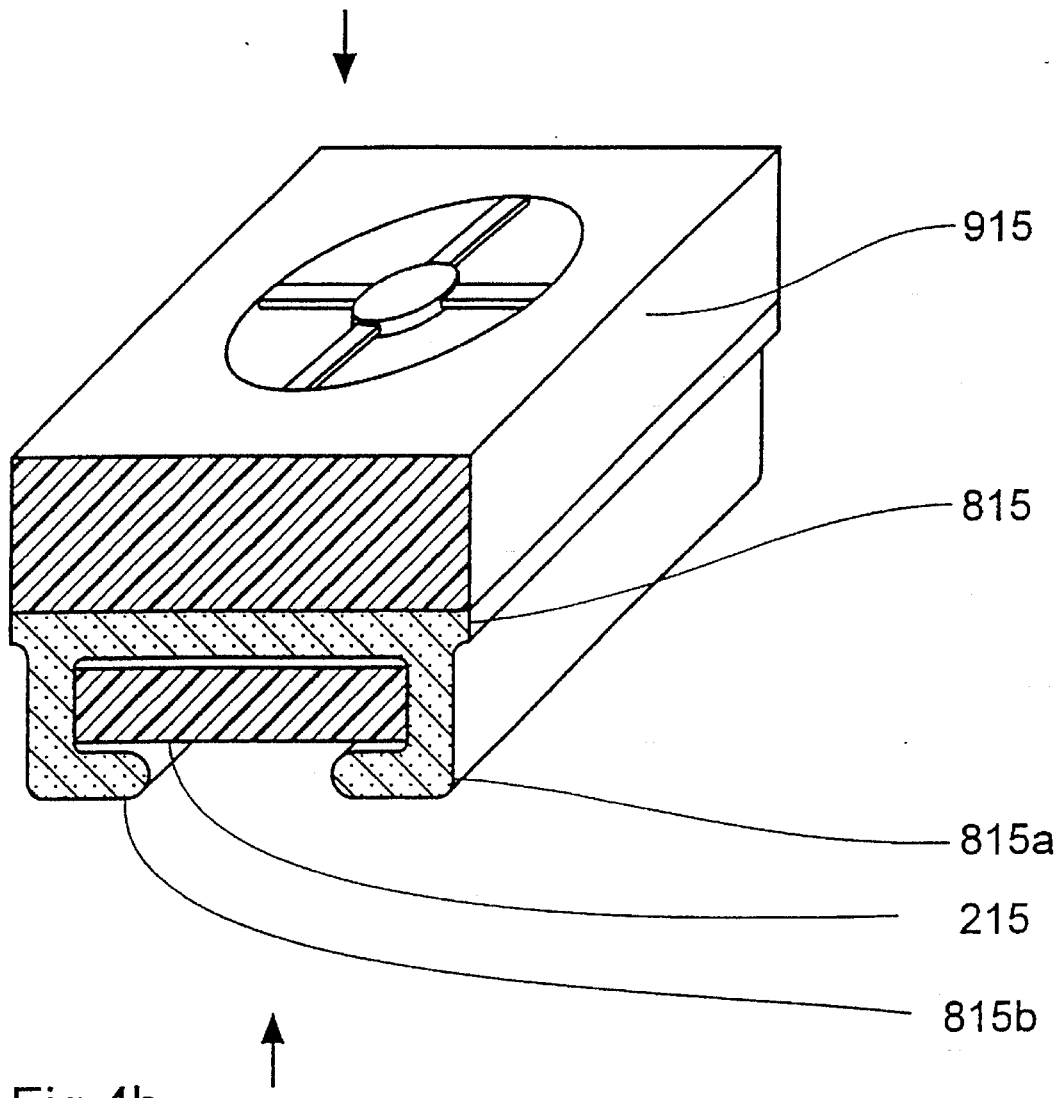

FIG. 4b shows a sectional view illustrating how an electronic component 215 can be "buttoned" into a body acting as a heat diffuser on an active ventilator element 915 provided with an elastic, heat-conducting structure 815, by having the transverse extent of the structure increasing as the spacing from the substrate increases. The sectional view shown in the Figure corresponds to a vertical sectional view in a direction perpendicular to the substrate, so that a collar region 815a secures the inserted component 215 along an annular, closed, line to prevent it falling out.

Figure 5A:
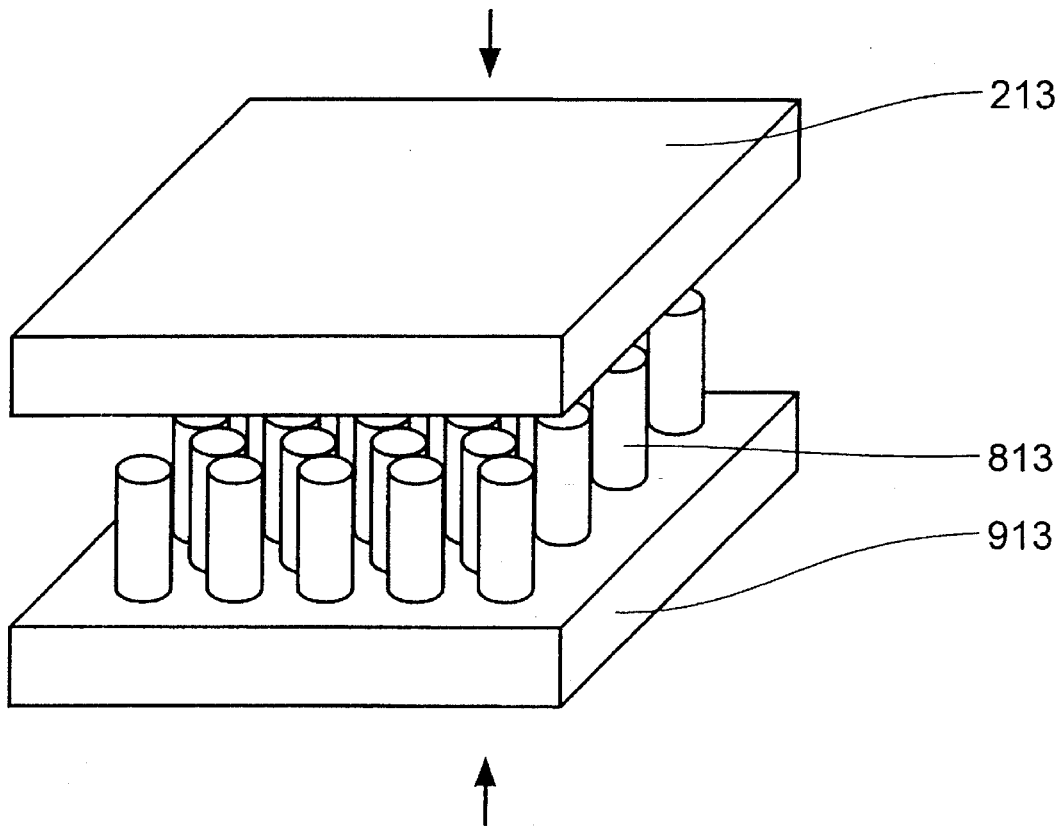
FIGS. 5a and 5b show another embodiment of the arrangement according to the invention before assembly and in the assembled state.
Figure 5B:
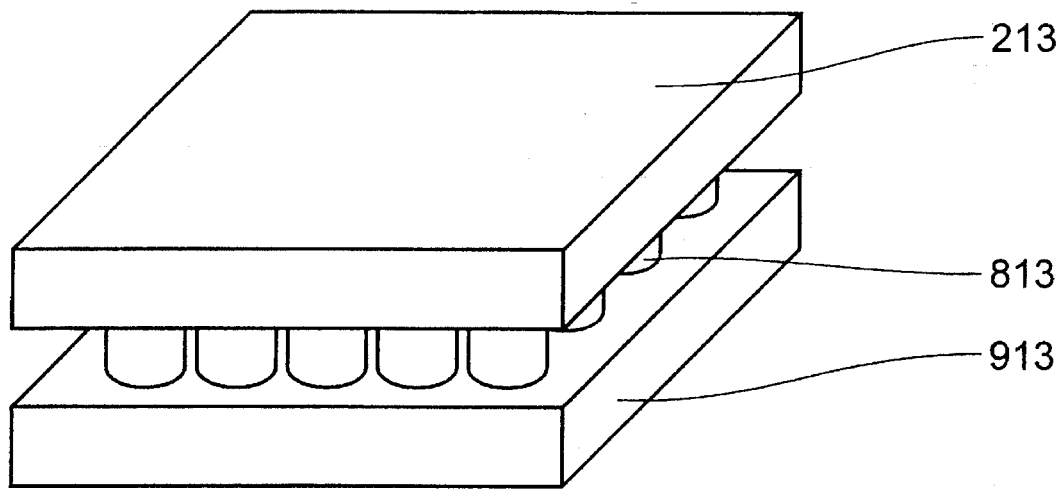

A similar final state is achieved with the arrangement diagrammatically shown in FIGS. 5a and 5b, wherein an assembly 213 is connected to a cooling member 913 by means of an array 813 of individual, highly elastic plastics knobs provided on the cooling member 913. The pressing together of the assembly 213 and cooling member 913 causes the knobs and recesses in the array 813 to be compressed in height so that their cross-section is enlarged and they substantially fill the space between the assembly and the cooling member and ensure a good transfer of heat.

Figure 6A:
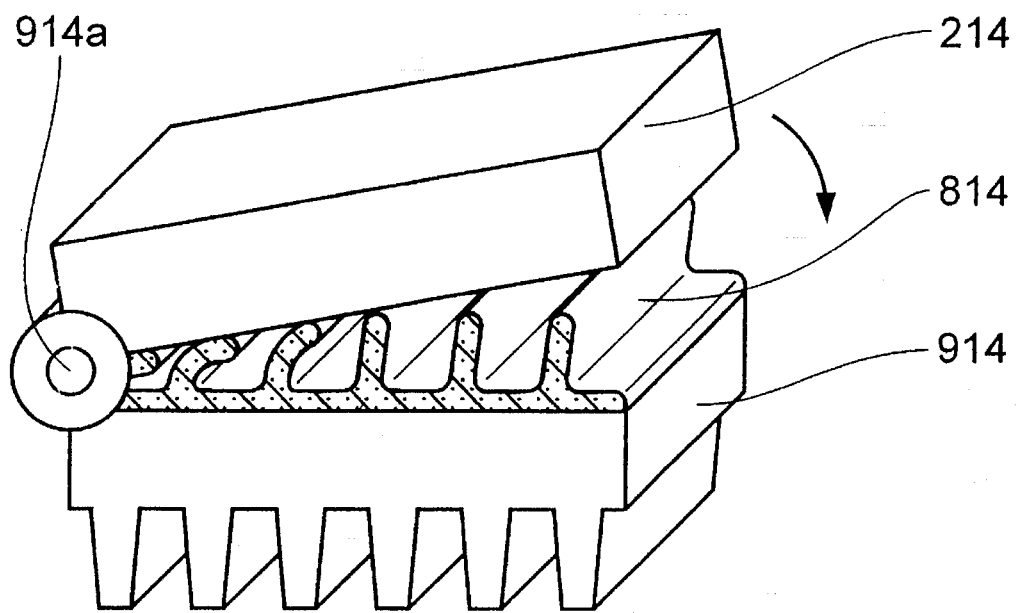
FIGS. 6a and 6b show another embodiment of the arrangement according to the invention, wherein an assembly carrier and an associated cooling member are connected by means of a hinge, thereby deforming a plastics molding located between them.
Figure 6B:
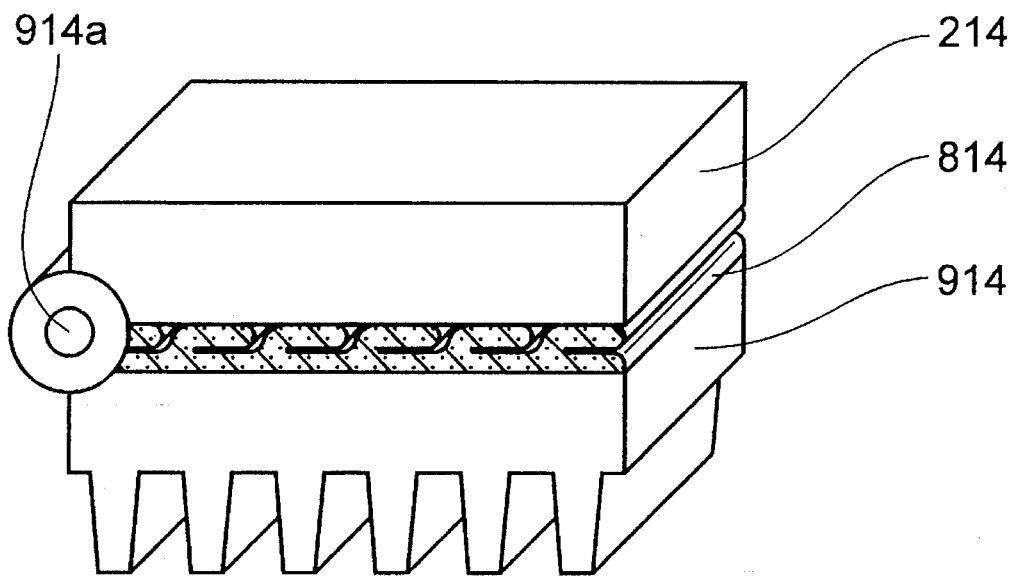

FIGS. 6a and 6b show another embodiment in which an assembly 214 and a ribbed cooling member 914 are connected by means of a hinge 914a, the cooling member having, on its unribbed surface, a plastics molding 814 with inclined ribs. When the assembly 214 and cooling member 914 are folded together, the ribs of the plastics molding 815 fit unidirectionally into the adjacent gap, as illustrated in FIG. 6a for the first rib from the left, and in FIG. 6b in the final position. This produces a substantially homogeneous heat transfer member between the assembly and cooling member, in which the adjacent surfaces are in close contact with one another.

The invention is not restricted in the embodiment to the examples described above. Rather, numerous possible variations are conceivable which would make use of the solution proposed but in fundamentally different forms. These include, in particular, arrangements for transferring heat outside the field of electronics, for example in measuring, heating, cooling and air conditioning.

We claim:

1. A process for producing an apparatus for conducting heat away from a housing of a heat generating assembly, the housing having at least one area defining a heat diffusing surface, the process comprising the steps of:
    a) positioning a nozzle adjacent a said area of the housing on which the apparatus is to be formed, the nozzle having an internal cross section;
    b) dispensing heat conducting polymeric material under pressure from a storage container through said nozzle on to said area, said dispensed material having the form of a first extruded strip with a cross-section which corresponds substantially to the internal cross section of the nozzle; and
    c) curing said polymeric material to form a body, which is at least partially elastically deformable.

2. The process according to claim 1, further comprising the step of guiding said nozzle by computer controlled drive means along a given route over the area of the part on which the apparatus is to be formed.

3. The process according to claim 1, further comprising the step of guiding said nozzle several times at least over selected area of the part where the apparatus is to be formed whereby a multilayer apparatus is formed, a given configuration of the apparatus being constructed from several extruded strips of the polymeric material, each successive strip being applied before the surface of the preceding strip has cured, so that the strips become integrally connected after curing.

4. The process according to claim 3 further comprising the step of forming layers of different polymeric materials whereby the layers have a different elasticity.

5. The process according to claim 1, wherein step b is performed at ambient temperature.

6. A process for producing an apparatus for conducting heat away from a housing of a heat generating assembly, the housing having at least one area defining a heat diffusing surface, the process comprising the steps of:
    a) positioning a nozzle adjacent an area of a part on which the apparatus is to be formed;
    b) dispensing heat conducting polymeric material under pressure from a storage container through said nozzle on to said area;
    c) curing said polymeric material to form a body which is at least partially elastically deformable; and
    d) engaging said body with the heat diffusing surface whereby heat is conducted from the heat diffusing surface by said body.

7. The process of claim 6, wherein said part comprises said heat diffusing surface of said housing, the nozzle has an internal cross-section, and said dispensed material has the form of a first extruded strip with a cross-section which corresponds substantially to the internal cross-section of the nozzle.

8. The process according to claim 7, wherein step b) further comprises the steps of:
    1) positioning the nozzle adjacent a second of said areas of the housing;
    2) dispensing said polymeric material on to said second area, said dispensed material having the form of a second extruded strip;
    3) repeating steps 1 and 2 to form a plurality of extruded strips, wherein said strips define a plurality of recesses.

9. The process according to claim 8, further comprising the steps of:
    e) forming a heat diffuser by
        1) positioning the nozzle adjacent a surface of a sheet of heat conducting material;
        2) dispensing said polymeric material on to said surface to form an extruded strip;
        3) repeating steps 1) and 2) to form a plurality of extruded strips, wherein the number of extruded strips formed on said heat diffuser is one more than the number of extruded strips formed on said housing, said strips on said heat diffuser defining a plurality of recesses; and
    f) engaging said strips and recesses on said housing with said strips and recesses on said heat diffuser in interlocking manner.

10. The process according to claim 6 wherein said part comprises a sheet of heat conducting material, the nozzle has an internal cross-section, and said dispensed material has a cross-section which corresponds substantially to the internal cross-section of the nozzle, wherein step b) further comprises the steps of:

1) positioning the nozzle adjacent said surface at a distance from said body;
2) dispensing said polymeric material on to said surface to form another body; and
3) repeating steps 1) and 2) to form a plurality of bodies wherein said bodies define a plurality of recesses;

wherein at least a part of said bodies extend into said recesses when said apparatus engages said housing.

11. The process according to claim 10, further comprising the step of forming a knob-like form.

12. The process according to claim 10, further comprising the step of forming a rib-like form.

13. The process according to claim 6 wherein said part comprises an active ventilator element, the body defines a housing for receiving the heat generating assembly and wherein said housing of said body engages the housing of the heat generating assembly to conduct heat from the housing of the assembly.

* * * * *

UNITED STATES PATENT AND TRADEMARK OFFICE
CERTIFICATE OF CORRECTION

PATENT NO. : 5,518,758
DATED : May 21, 1996
INVENTOR(S) : Bernd Tiburtius et al

It is certified that error appears in the above-indentified patent and that said Letters Patent is hereby corrected as shown below:

Column 8, line 11, change "area" to --areas--.

Signed and Sealed this

Twenty-second Day of October, 1996

Attest:

BRUCE LEHMAN

Attesting Officer     Commissioner of Patents and Trademarks